(12) United States Patent
Tanaka

(10) Patent No.: US 7,601,626 B2
(45) Date of Patent: Oct. 13, 2009

(54) METHOD FOR MANUFACTURING SEMICONDUCTOR DEVICE, AND METHOD AND STRUCTURE FOR IMPLEMENTING SEMICONDUCTOR DEVICE

(75) Inventor: Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/102,416

(22) Filed: Apr. 14, 2008

(65) Prior Publication Data

US 2008/0206980 A1   Aug. 28, 2008

Related U.S. Application Data

(62) Division of application No. 11/386,019, filed on Mar. 21, 2006, now Pat. No. 7,524,700.

(30) Foreign Application Priority Data

| Mar. 23, 2005 | (JP) | ............................ 2005-084583 |
| Mar. 23, 2005 | (JP) | ............................ 2005-084584 |
| Nov. 29, 2005 | (JP) | ............................ 2005-344647 |

(51) Int. Cl.
 *H01L 21/44* (2006.01)
(52) U.S. Cl. ........... 438/612; 257/E23.02; 257/E23.021
(58) Field of Classification Search .................. 438/612
 See application file for complete search history.

(56) References Cited

U.S. PATENT DOCUMENTS

| 5,359,768 | A |  | 11/1994 | Haley ........................... 29/840 |
| 5,477,087 | A |  | 12/1995 | Kawakita et al. |
| 5,897,568 | A |  | 4/1999 | Vanraes ...................... 606/162 |
| 6,277,669 | B1 | * | 8/2001 | Kung et al. .................. 438/106 |
| 6,515,370 | B2 |  | 2/2003 | Hashimoto ................... 257/777 |
| 6,710,446 | B2 |  | 3/2004 | Nagai et al. .................. 257/737 |
| 6,822,317 | B1 |  | 11/2004 | Inoue et al. |
| 6,914,333 | B2 |  | 7/2005 | Lo et al. ...................... 257/737 |
| 6,930,388 | B2 |  | 8/2005 | Yamaguchi et al. |
| 6,936,928 | B2 |  | 8/2005 | Hedler et al. ................ 257/778 |
| 7,057,283 | B2 |  | 6/2006 | Inoue et al. |
| 7,061,061 | B2 |  | 6/2006 | Goodman et al. |
| 7,061,081 | B2 |  | 6/2006 | Yano et al. |
| 7,161,245 | B2 |  | 1/2007 | Saito |
| 7,312,533 | B2 | * | 12/2007 | Haimerl et al. ............. 257/779 |
| 2005/0006788 | A1 |  | 1/2005 | Kaneko |
| 2006/0286790 | A1 | * | 12/2006 | Yamasaki et al. ........... 438/612 |

FOREIGN PATENT DOCUMENTS

| JP | 64-013734 | 1/1989 |
| JP | 05-243231 | 9/1993 |
| JP | 06-326108 | 11/1994 |
| JP | 07-263493 | 10/1995 |
| JP | 10-027824 | 1/1998 |

(Continued)

*Primary Examiner*—David A Zarneke
(74) *Attorney, Agent, or Firm*—Harness, Dickey & Pierce, P.L.C.

(57) ABSTRACT

A method for manufacturing a semiconductor device includes forming an electrode; forming a projection projecting with respect to the electrode by melting a resin; and providing a conductive layer electrically connected to the electrode. The conductive layer is extended to an upper surface of the projection. Therefore, productivity of the semiconductor is improved.

2 Claims, 6 Drawing Sheets

FOREIGN PATENT DOCUMENTS

| | | |
|---|---|---|
| JP | 11-016943 | 1/1999 |
| JP | 2001-110831 | 4/2001 |
| JP | 2002-237546 | 8/2002 |
| JP | 2003-124244 | 4/2003 |
| JP | 2004-186333 | 7/2004 |
| JP | 2005-5568 | 1/2005 |
| JP | 2005-101527 | 4/2005 |
| JP | 2005-136402 | 5/2005 |

* cited by examiner

Fig. 7

| Curing Temperature of Joint Material 25 \ Load | 5kgf/cm² | 10kgf/cm² |
|---|---|---|
| 210°C | Break Not Observed | Break Observed |
| 270°C | Break Observed | Break Observed |

The glass transition temperature of the resin forming the projection 5 is approximately 220 degrees Celsius.

| Curing Temperature of Joint Material 25 \ Load | 5kgf/cm² | 10kgf/cm² |
|---|---|---|
| 210°C | Break Not Observed | Break Not Observed |
| 270°C | Break Not Observed | Break Not Observed |

The glass transition temperature of the resin forming the projection 5 is approximately 300 degrees Celsius.

Fig. 8A

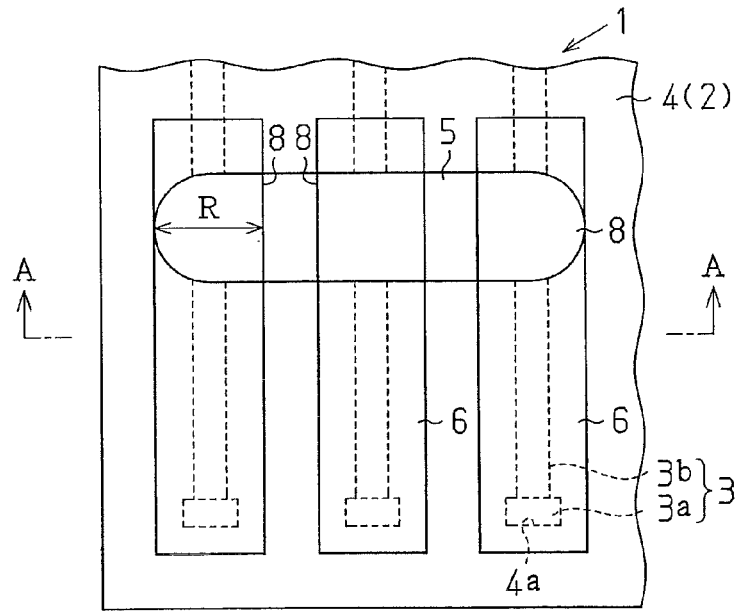

Fig. 8B

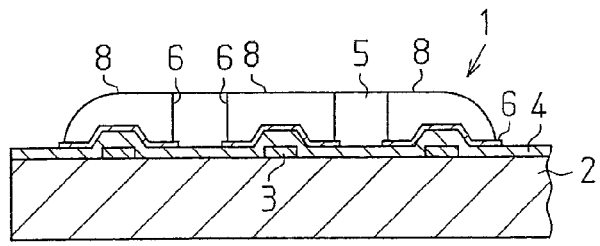

METHOD FOR MANUFACTURING SEMICONDUCTOR DEVICE, AND METHOD AND STRUCTURE FOR IMPLEMENTING SEMICONDUCTOR DEVICE

CROSS-REFERENCE TO RELATED APPLICATIONS

This application is a divisional patent application of U.S. Ser. No. 11/386,019 filed Mar. 21, 2006, claiming priority to Japanese Patent Application Nos. 2005-084583 filed Mar. 23, 2005, 2005-084584 filed Mar. 23, 2005, and 2005-344647 filed Nov. 29, 2005, all of which are incorporated herein by reference.

BACKGROUND OF THE INVENTION

The present invention relates to methods for manufacturing semiconductor devices, and methods and structures for implementing the semiconductor devices.

Conventionally, Chip On Glass (COG) connection is known as a connection method used for implementing a driver IC on a substrate of a display device. In the COG connection, for example, an Au plating bump (hereinafter, a "bump") is formed in the driver IC as an electrode. Then, using a conductive joint material such as an anisotropic conductive film (ACF) or an anisotropic conductive paste (ACP), the bump is electrically connected with a terminal electrode formed on the substrate of the display device. The driver IC is thus implemented on the substrate.

However, recently, smaller-sized electrodes are often employed (smaller-pitched arrangement of electrode is often used). The pitch between the electrodes thus becomes substantially equal to the size of a conductive particle contained in the ACF. Accordingly, the conductive particle may interfere with the electrodes, causing a short circuit.

So as to avoid the problem, a joint material free from conductive particles (for example, a non-conductive paste (NCP)) may be used for implementing the driver IC on the substrate. However, this hampers contact between the bump of the driver IC and the terminal electrode on the substrate. Such failure of contact decreases the reliability of connection between the driver IC and the terminal electrode.

In order to maintain the connection reliability, a projection electrode (Japanese Laid-Open Patent Publication No. 64-13734 (=No. 1-13734)) may be used. More specifically, the projection electrode has a projection formed of resin and wiring provided in the projection. The traces of wiring extend from an electrode formed in the driver IC. The projection electrode contacts the terminal electrode formed on the substrate. In this state, a distal portion of the projection electrode is pressed against the terminal electrode and thus deformed. This increases the contact area between the projection electrode and the terminal electrode, maintaining stable communication between the projection electrode of the driver IC and the terminal electrode of the substrate. Accordingly, regardless of the use of the joint material free from the conductive particles, the reliability of the communication between the bump of the driver IC and the terminal electrode of the substrate is maintained.

To form the projection electrode, the projection is shaped by curing photosensitive insulating resin, or the material of the projection, through exposure to, for example, ultraviolet rays. However, in this case, as a lamp for exposure deteriorates, the condition for exposure may change. This makes it difficult to shape the projection, decreasing productivity of the semiconductor device.

Further, if a core portion of the projection electrode is formed of a resin with relatively low elasticity such as silicone, the resin may deform excessively under certain conditions when pressed for implementation. This may cause a break of the traces of the projection electrode, thus decreasing the reliability of connection between the projection electrode of the driver IC and the terminal electrode of the substrate. In addition, in order to improve the productivity, the joint material may be formed of a material that is cured in a relatively short curing time if the curing temperature is raised. It is thus necessary to configure the projection electrode in such a manner that the connection between the projection electrode and the terminal electrode is reliably maintained when heated in implementing of the IC driver on the substrate.

SUMMARY

Accordingly, it is an objective of the present invention to provide a method for manufacturing a semiconductor device that improves productivity of the semiconductor.

It is another objective of the present invention to provide a method and a structure for implementing a semiconductor device that improve reliability of connection between an electrode formed in the semiconductor device and an electrode formed in a substrate.

According to a first aspect of the invention, a method for manufacturing a semiconductor device is provided. The method includes forming an electrode; forming a projection projecting with respect to the electrode by melting a resin; and providing a conductive layer electrically connected to the electrode. The conductive layer is extended to an upper surface of the projection.

According to a second aspect of the invention, a method for manufacturing a semiconductor device is provided. The method includes forming an electrode on a substrate; providing a protection film that covers the electrode; forming a resin projecting body on the protection layer; forming a projection having a smooth and curved surface by melting the projecting body; and providing a conductive layer that covers the projection and is electrically connected to the electrode.

According to a third aspect of the invention, a method for implementing a semiconductor device is provided. The semiconductor device includes an electrode, a projection that is formed of a first resin and projects with respect to the electrode, and a conductive layer that is electrically connected to the electrode and covers an upper surface of the projection. The method includes preparing a second resin the curing temperature of which is lower than the glass transition temperature of the first resin. The method further includes implementing the semiconductor device on a mounting substrate with a joint material formed of the second resin arranged between the semiconductor device and the mounting substrate through heating and pressurization.

According to a fourth aspect of the invention, a method for implementing a semiconductor device on a mounting substrate is provided. The method includes forming a projection that projects with respect to an electrode provided in the semiconductor device using a first resin. The method further includes providing a conductive layer that is electrically connected to the electrode and covers the projection. The method further includes forming a joint material using a second resin the curing temperature of which is lower than the glass transition temperature of the first resin. The method further includes arranging the joint material between the semiconductor device and the mounting substrate. The method further includes performing heating and pressurization on the joint material, the semiconductor device, and the mounting substrate with the joint material located between the semiconductor device and the mounting substrate.

According to a fifth aspect of the invention, a structure for implementing a semiconductor device is provided. The semiconductor device includes an electrode, a projection that is formed of a first resin and projects with respect to the electrode, and a conductive layer that is electrically connected to the electrode and covers an upper surface of the projection. The semiconductor device is implemented on the mounting substrate with a joint material arranged between the semiconductor device and the mounting substrate through heating and pressurization. The joint material is formed of a second resin, the glass transition temperature of the first resin being higher than the curing temperature of the second resin.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 7 is a diagram representing whether a break occurs in a conductive layer in correspondence with the mounting temperature and the pressing condition in the method of FIG. 6B;

FIG. 8A is a plan view showing a semiconductor device according to another embodiment of the present invention; and FIG. 8B is a cross-sectional view taken along line A-A of FIG. 8A.

DETAILED DESCRIPTION OF THE PREFERRED EMBODIMENTS

An embodiment of the present invention will now be described with reference to the attached drawings.

Figure 1A:
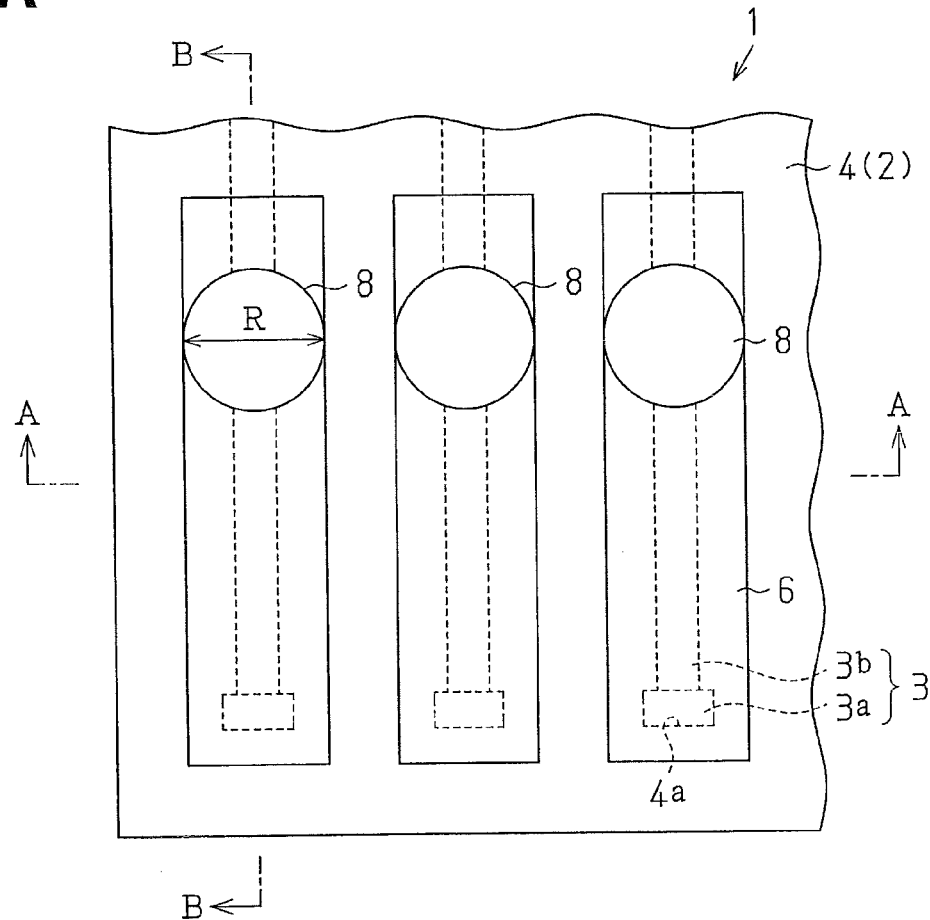
FIG. 1A is a schematic view showing the structure of a semiconductor device according to an embodiment of the present invention.
Figure 1B:
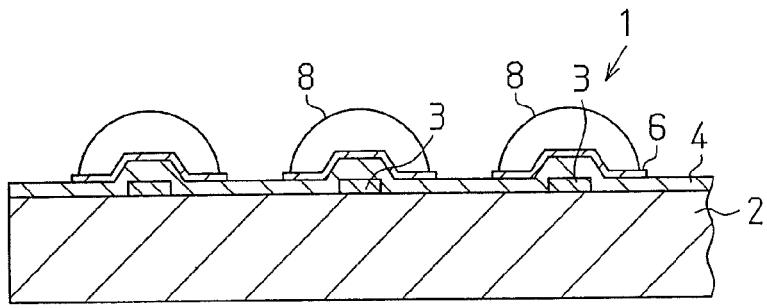
FIG. 1B is a cross sectional view taken along line A-A of FIG. 1A, showing the semiconductor device.
Figure 1C:
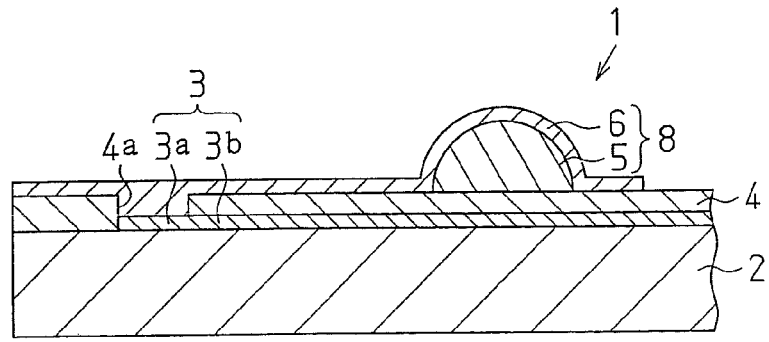
FIG. 1C is a cross sectional view taken along line B-B of FIG. 1A, showing the semiconductor device.

A semiconductor device 1 according to the present invention will hereafter be described. FIG. 1A is a plan view showing a main portion of the semiconductor device 1 of a liquid crystal display device. FIG. 1B is a cross-sectional view taken along line A-A of FIG. 1A. FIG. 1C is a cross-sectional view taken along line B-B of FIG. 1A.

As shown in FIGS. 1A to 1C, the semiconductor device 1 includes a plurality of electrodes 3 formed on a semiconductor substrate 2. Electric signals are input or output through each of the electrodes 3. Each electrode 3 includes an electrode pad 3a and a trace 3b connected to the electrode pad 3a. In this embodiment, the electrodes 3 are formed in the vicinity of an end of the semiconductor substrate 2 as spaced at a predetermined pitch. The electrodes 3 are formed of aluminum.

The electrodes 3 are covered by a protection film 4. A plurality of openings 4a are defined in the protection film 4 in correspondence with the electrode pads 3a. The electrode pad 3a forming a part of each electrode 3 is exposed to the exterior through the corresponding one of the openings 4a. In the illustrated embodiment, the protection film 4 is formed by an insulating film of silicon oxide.

Referring to FIGS. 1A to 1C, a plurality of substantially semispherical projections 5 are provided on the upper surface of the protection film 4 deposited on the semiconductor substrate 2. Each of the projections 5 is arranged in correspondence with one of the electrodes 3. The apex of each projection 5 is located above the upper surface of the corresponding electrode 3. The projections 5 are spaced at a pitch substantially equal to that of the electrodes 3. In the illustrated embodiment, each projection 5 is formed of photosensitive resin, which is acrylic resin.

Referring to FIG. 1C, a plurality of conductive layers 6 are formed on the protection film 4. Each of the conductive layers 6 covers the corresponding one of the projections 5 and the associated electrode 3. Each conductive layer 6 is electrically connected to the electrode pad 3a of the associated electrode 3 through the corresponding opening 4a. Each of projections 5 and the corresponding conductive layer 6, which covers the entire portion of the upper surface of the projection 5, form one of the projection electrodes 8. In the illustrated embodiment, each conductive layer 6 is formed of gold and shaped through patterning in such a manner that the conductive layer 6 has a dimension substantially equal to a dimension (R) of the bottom of each projection 5. As has been described, the semiconductor device 1 includes the projection electrodes 8 that are formed on the semiconductor substrate 2 and electrically connected to the corresponding electrodes 3.

A method for manufacturing the semiconductor device 1 of the present invention will hereafter be explained referring to FIGS. 2 to 4. The drawings are cross-sectional views taken along line B-B of FIG. 1A and illustrate the method sequentially in the order of the drawings.

Figure 2A:
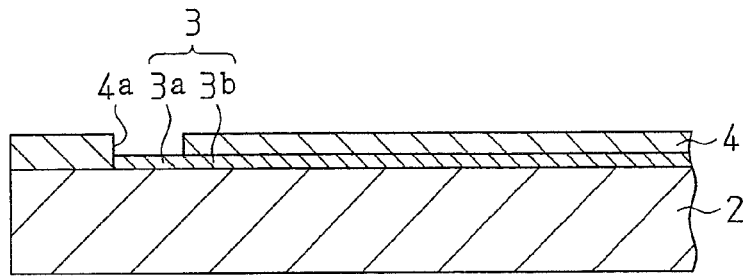
FIGS. 2A to 2D are cross-sectional views for explaining a method for manufacturing the semiconductor device of FIG. 1A.

First, referring to FIG. 2A, each electrode 3 is formed of aluminum at a predetermined position on the semiconductor substrate 2. The electrode (the trace 3b) is then covered by the protection film 4 having the opening 4a through which the electrode pad 3a of the electrode 3 is exposed to the exterior. More specifically, a layer of silicon oxide is deposited on the semiconductor substrate 2 on which the electrodes 3 are formed. Subsequently, a non-illustrated resist layer is provided on the layer of silicon oxide through, for example, a spin coating method, a dipping method, or a spray coating method. The resist layer is then subjected to exposure and development (photolithographic treatment) using a mask in which a prescribed pattern is formed. Next, using a resist pattern that has been patterned in accordance with a prescribed shape, the layer of silicon oxide is subjected to etching. This provides the protection film 4 having the openings 4a through which the electrode pads 3a of the electrodes 3 are exposed. Afterwards, the resist pattern is removed using, for example, release agent.

Figure 2B:
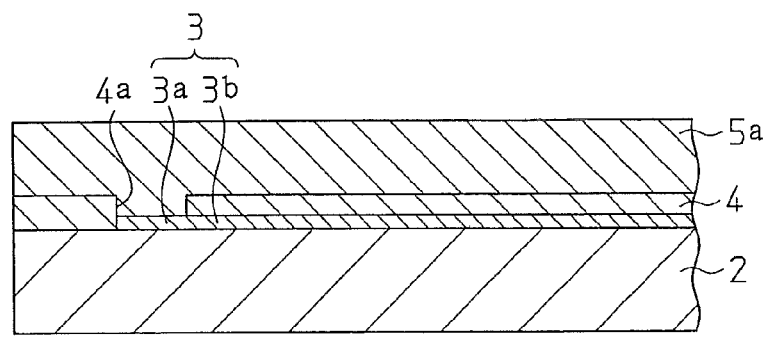

Next, referring to FIG. 2B, acrylic resin, which is photosensitive resin forming positive type resist, is applied on the protection film 4 for forming the projections 5. The acrylic resin is then pre-baked for providing a resin layer 5a. In the illustrated embodiment, a light curing agent (an ultraviolet curing agent) is added to the acrylic resin by an amount that permits the acrylic resin to re-melt when heated after curing.

Figure 2C:
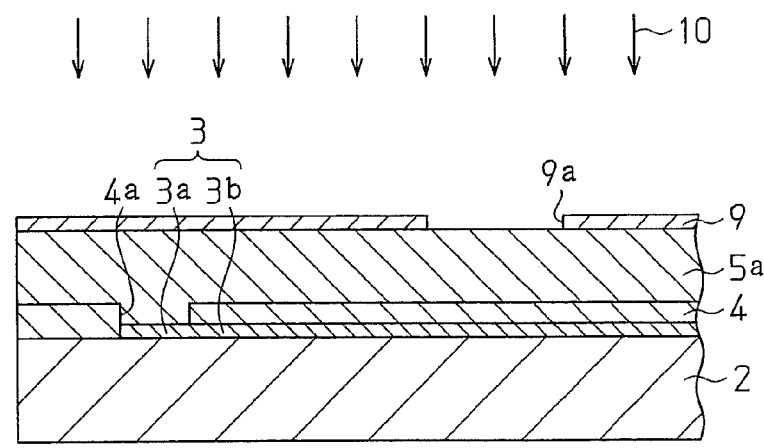

With reference to FIG. 2C, a mask 9 is then positioned at a predetermined position on the resin layer 5a. In the illustrated embodiment, the mask 9 is formed by, for example, a glass plate including a light shielding film formed of, for example, chrome. The mask 9 has circular openings 9a shaped in correspondence with the shape of each semispherical projection 5 as viewed from above. The mask 9 is positioned in such a manner that the openings 9a of the mask 9 correspond to the positions at which the projections 5 are to be provided.

Figure 2D:
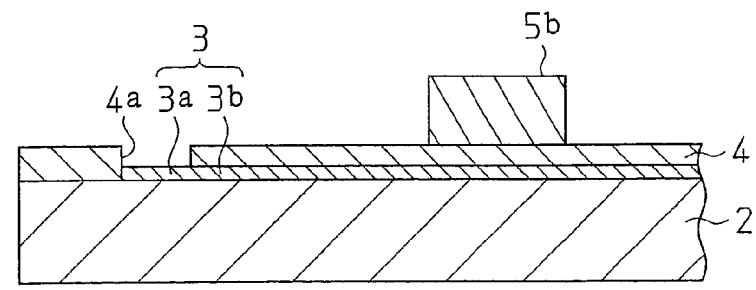

Subsequently, ultraviolet rays 10 are radiated onto the mask 9 by a non-illustrated ultraviolet lamp. In this manner, the resin layer 5a exposed from the openings 9a is exposed to the ultraviolet rays 10. More specifically, the ultraviolet rays 10 are radiated by a standard amount in correspondence with the material or the thickness of the resin layer 5a. The portions of the resin layer 5a exposed from the openings 9a are thus cured. The non-exposed portions (the non-cured portions) of the resin layer 5a other than the portions exposed from the openings 9a are subjected to development and then removed. As a result, as shown in FIG. 2D, columnar projecting bodies 5b each having a flat upper end are obtained from the resin layer 5a.

Figure 3A:
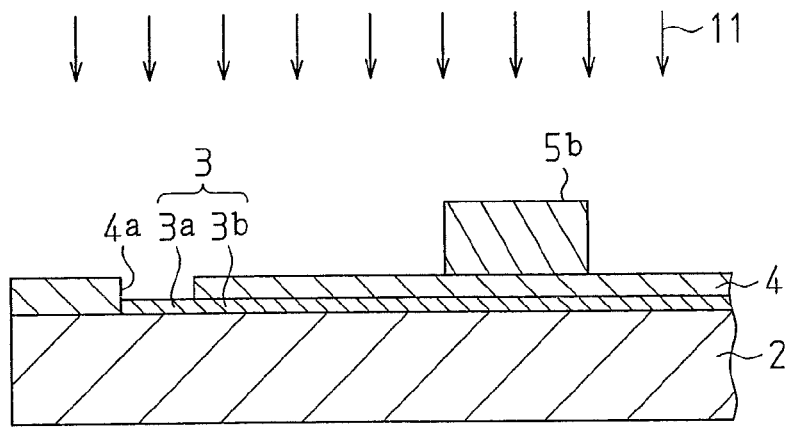
FIGS. 3A to 3C are cross-sectional views for explaining the method for manufacturing the semiconductor device of FIG. 1A.
Figure 3B:
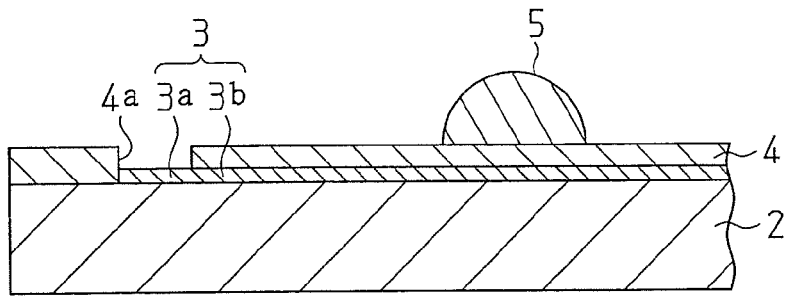

With reference to FIG. 3A, infrared rays 11 are then radiated onto the columnar projecting bodies 5b by a non-illustrated infrared lamp, thus heating the projecting bodies 5b. More specifically, by radiating the infrared rays 11 onto the projecting bodies 5b formed of the ultraviolet-cured acrylic resin, the projecting bodies 5b are heated to a temperature at which the acrylic resin melts. Although the acrylic resin has been cured by the ultraviolet curing agent, the amount of the ultraviolet curing agent added to the resin is restricted to the aforementioned amount. Thus, at this stage, the acrylic resin has not yet reached a high-density cross-linked state. This permits the acrylic resin forming the columnar projecting bodies 5b to melt when heated by the infrared rays 11. In this manner, surface tension is produced in the acrylic resin in a molten state and deforms the originally flat upper end of each projecting body 5b to a smoothly curved surface. As a result, the substantially semispherical projections 5 are formed from the originally columnar projecting bodies 5b (see FIG. 3B).

Figure 3C:
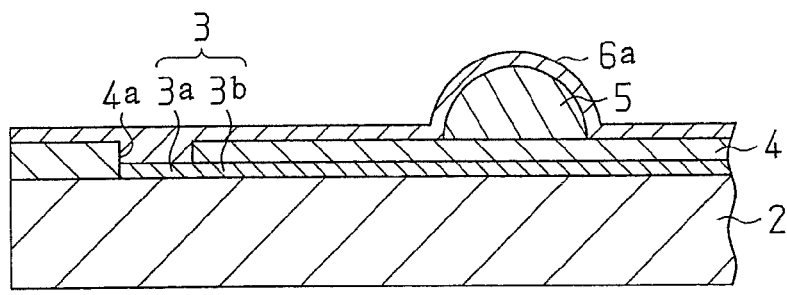

Next, referring to FIG. 3C, a film of conductive metal is deposited through sputtering on the entire portion of the surface of the semiconductor substrate 2, which includes the portion (the electrode pad 3a) of each electrode 3 exposed from the corresponding opening 4a of the protection film 4 and the upper surface of each projection 5. In this manner, conductive material layers 6a are completed. In the illustrated embodiment, each conductive material layer 6a is formed of gold. The conductive material layer 6a is patterned in such a manner as to have a dimension substantially equal to the dimension R of the bottom of each projection 5.

Figure 4A:
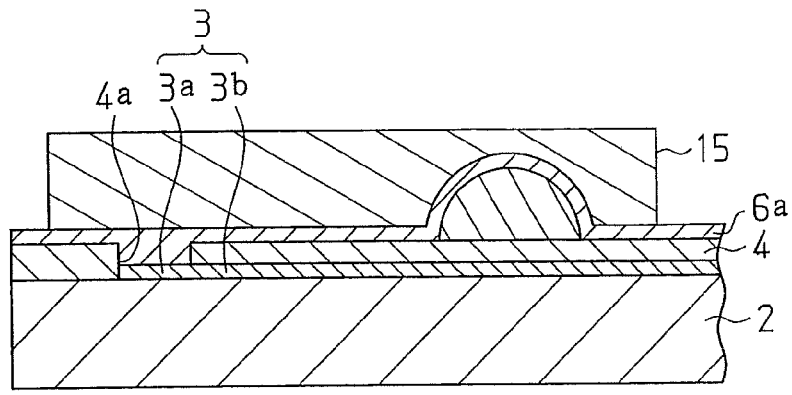
FIGS. 4A to 4C are cross-sectional views for explaining the method for manufacturing the semiconductor device of FIG. 1A.

Resist is then applied onto the entire portion of the upper surface of each conductive material layer 6a by a spin coating method, a dipping method, or a spray coating method, thus forming a resist film. Subsequently, using a mask corresponding to the shape (the pattern) of each conductive material layer 6a as viewed from above, the resist layer is subjected to exposure to light and development. In this manner, the resist layer is patterned in a predetermined shape, providing a resist pattern 15 corresponding to the patterned shape of each conductive layer 6, as shown in FIG. 4A.

Figure 4B:
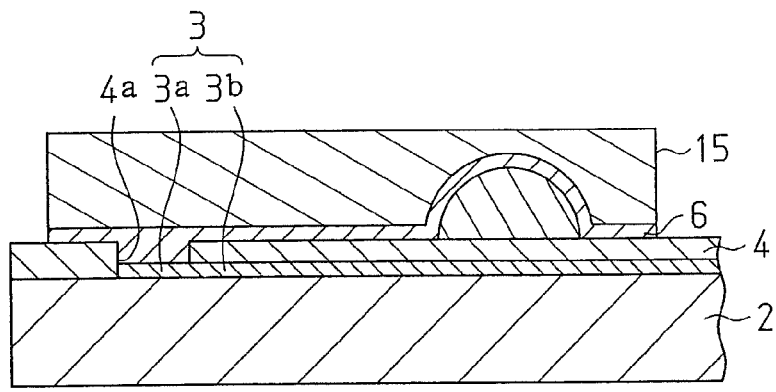
Figure 4C:
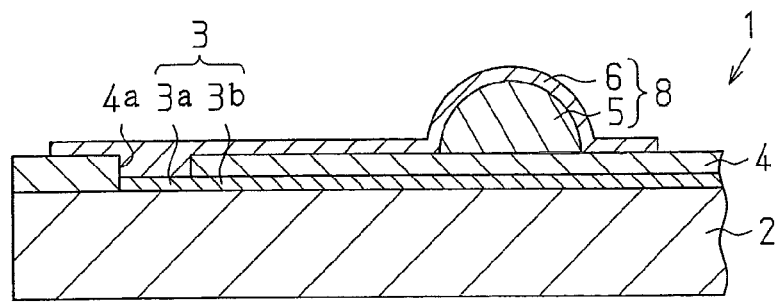

The portions of each conductive material layer 6a that are exposed with respect to the resist pattern 15 are then removed through etching. This forms the conductive layers 6, each of which covers the protection film 4 including the corresponding opening 4a and the entire upper surface of the corresponding projection 5, as shown in FIG. 4B. The conductive layer 6 is electrically connected to the corresponding electrode 3. The resist pattern 15 is then removed using release agent as shown in FIG. 4C. As a result, each of the projection electrodes 8 is formed by the associated projection 5 and the conductive layer 6 covering the entire upper surface of the projection 5. As has been described, the semiconductor device 1 having the semispherical projections 5 can be manufactured without being influenced by conditions for exposure to the ultraviolet rays 10.

The illustrated embodiment has the following advantages.

(1) In the illustrated embodiment, the projections 5 are shaped by melting the acrylic resin. More specifically, surface tension is caused in the acrylic resin in a molten state. This forms the semispherical projections 5 each having a semicircular cross-sectional shape. Accordingly, the projections 5 are shaped without being influenced by the conditions for exposure to the ultraviolet rays 10. The productivity of the semiconductor device 1 is thus raised.

(2) In the illustrated embodiment, the projections 5 are formed of the acrylic resin as the photosensitive resin. In other words, the acrylic resin is exposed to and thus cured by the ultraviolet rays 10. In this manner, the columnar projecting bodies 5b each having the flat upper end are provided. Accordingly, by melting the projecting bodies 5b, the substantially semispherical projections 5 are easily formed.

(3) In the illustrated embodiment, the acrylic resin is heated and molten by the infrared rays 11. Since the surface tension is produced in the molten acrylic resin, the substantially semispherical projections 5 are provided. Accordingly, the projections 5 are formed without being influenced by the conditions for exposure to the ultraviolet rays 10. This reliably increases the productivity of the semiconductor device 1.

Figure 5:
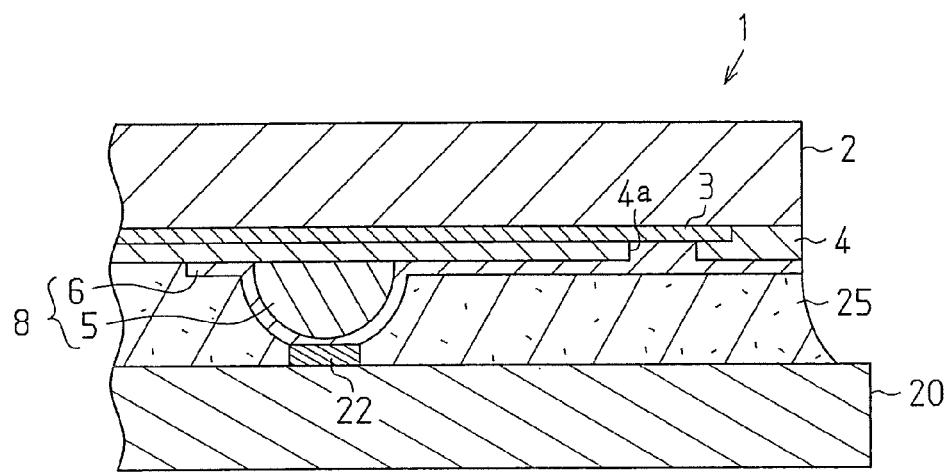
FIG. 5 is an enlarged cross-sectional view showing a main portion of a section of the semiconductor device of FIG. 1A at which the semiconductor device is implemented on a wiring substrate through the COG connection.

With reference to FIGS. 5 to 7, a method and a structure for mounting the semiconductor device 1, which is constructed as above-described, on a wiring substrate 20 as a mounting substrate through COG packaging will be explained.

As has been described, each projection 5 is formed of the acrylic resin as the photosensitive insulating resin. This decreases the cost for forming the projections 5 compared to a case in which each projection 5 is formed of conductive resin.

However, the projections 5 may be formed of a different resin such as phenol resin, polyimide resin, and epoxy resin, other than the acrylic resin. The following description focuses on a case in which the projections 5 are formed of phenol resin. The phenol resin corresponds to a first resin having a glass transition temperature of approximately 300 degrees Celsius.

FIG. 5 is an enlarged cross-sectional view showing a portion of the semiconductor device 1 at which the semiconductor device 1 is implemented on the wiring substrate 20, or the mounting substrate, through COG packaging. With reference to FIG. 5, a terminal electrode 22 is formed on the wiring substrate 20. The projection electrode 8 is connected to an upper surface of the terminal electrode 22. The terminal electrode 22 is arranged at a position corresponding to the position of the projection electrode 8 of the semiconductor device 1. More specifically, the projection electrode 8 of the semiconductor device 1 is connected to the terminal electrode 22 of the wiring substrate 20 by N on the conductive paste (NCP) method. That is, the semiconductor device 1 is implemented on the wiring substrate 20 with a joint material 25, which is an NCP, located between the semiconductor device 1 and the wiring substrate 20. This fixes the projection electrode 8 and the terminal electrode 22 in a state electrically connected to each other.

A method for implementing the semiconductor device 1 on the wiring substrate 20 will hereafter be explained with reference to FIGS. 6A to 6B.

Figure 6A:
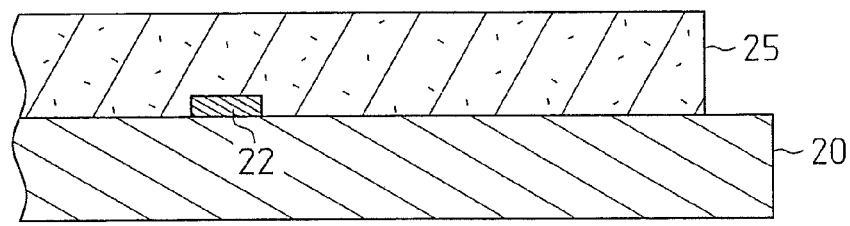
FIGS. 6A and 6B are cross-sectional views for explaining implementation of the semiconductor device of FIG. 1A on the wiring substrate.
Figure 6B:
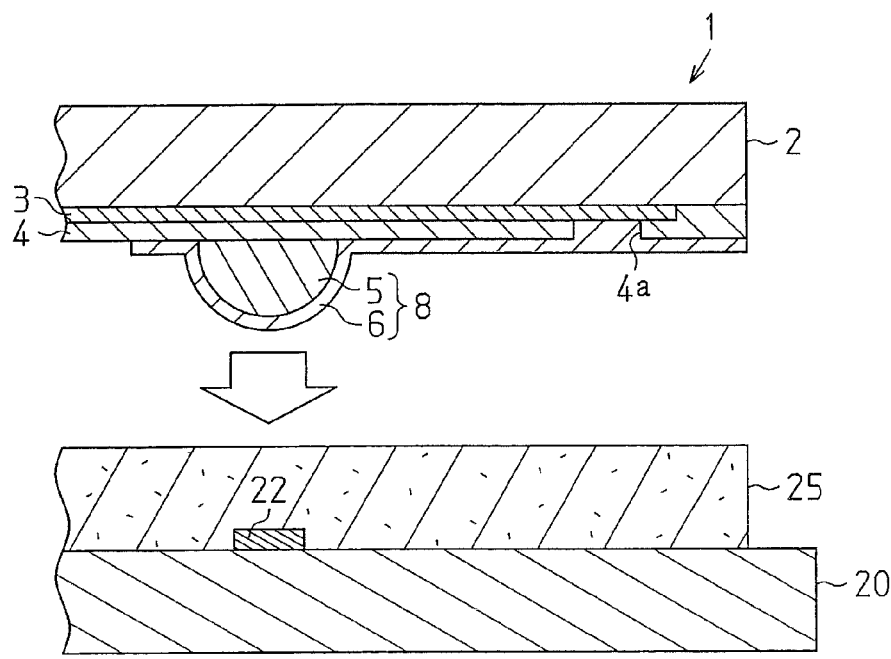

As shown in FIG. 6A, the joint material 25 for implementing the semiconductor device 1 on the wiring substrate 20 is applied on the wiring substrate 20. In the illustrated embodiment, the joint material 25 is formed of epoxy resin the curing temperature of which is approximately 270 degrees Celsius. With reference to FIG. 6B, the projection electrode 8 of the semiconductor device 1 is positioned relative to the terminal electrode 22 of the wiring substrate 20. The semiconductor substrate 2 and the wiring substrate 20 are then heated and pressed using a flip chip bonder. In this manner, the semiconductor device 1 is implemented on the wiring substrate 20 with the joint material 25 arranged between the semiconductor device 1 and the wiring substrate 20 as shown in FIG. 5.

FIG. 7 shows diagrams representing the break state of the conductive layer 6 of the projection electrode 8 in each of the cases in which the semiconductor substrate 2 and the wiring substrate 20 were pressed and heated at the mounting temperature of 210 or 270 degrees Celsius and under the pressing condition of 5 kgf/cm$^2$ (0.49 MPa) or 10 kgf/cm$^2$ (0.98 MPa). In the illustrated embodiment, such pressing and heating were performed on the semiconductor substrate 2 having the projections 5 formed of acrylic resin and the semiconductor substrate 2 having the projections 5 formed of phenol resin. The glass transition temperature of the acrylic resin and that of the phenol resin are approximately 220 degrees Celsius and approximately 300 degrees Celsius, respectively.

In the case in which each projection 5 was formed of the acrylic resin, the elasticity coefficient of the projection 5 decreased at the mounting temperature of 210 degrees Celsius, which was close to the glass transition temperature of the acrylic resin, 220 degrees Celsius. That is, not only at the mounting temperature of 270 degrees Celsius but also at the mounting temperature of 210 degrees Celsius, the projection 5 deformed greatly when the semiconductor device 1 was pressed at 10 kgf/cm$^2$. This caused a break of the conductive layer 6 of the projection electrode 8, which could not tolerate the deformation of the projection 5. Accordingly, mounting of the semiconductor device 1 on the wiring substrate 20 must be performed under the relatively low load, or 5 kgf/cm$^2$.

Contrastingly, in the case in which each projection 5 was formed of the phenol resin, the glass transition temperature of which is higher than 270 degrees Celsius, the elasticity coefficient of the projection 5 was maintained both at the mounting temperature of 210 degrees Celsius and the mounting temperature of 270 degrees Celsius. This prevented the projection 5 from greatly deforming so that the conductive layer 6 had no breaks.

More specifically, at the mounting temperature of 270 degrees Celsius, each projection electrode 8 was positioned relative to the associated terminal electrode 22. The semiconductor substrate 2 and the wiring substrate 20 were then heated and pressed using the flip chip bonder. As has been described herein, the projection 5 was formed of the phenol resin the glass transition temperature of which is approximately 300 degrees Celsius. Thus, under this mounting temperature, the elasticity coefficient of the phenol resin was maintained at a relatively high level without being lowered. Accordingly, even when the joint material 25, or the NCP, was cured through pressing by the flip chip bonder, or at the mounting temperature of 270 degrees Celsius, the projection 5, which was formed of the phenol resin, did not deform excessively. In other words, the load caused by the pressing by the flip chip bonder focally act on a portion of the substantially semispherical projection 5 in the vicinity of the apex of the projection 5. Deformation was thus limited to the resin corresponding to this portion. This prevented the conductive layer 6 from having breaks, and thus maintained the electrical connection between each projection electrode 8 of the semiconductor device 1 and the associated terminal electrode 22 of the wiring substrate 20. Accordingly, regardless of whether the mounting temperature was 210 or 270 degrees Celsius and whether the pressing condition was 5 or 10 kgf/cm$^2$, the elasticity coefficient of the phenol resin forming the projection 5 was maintained at the high level. The projection 5, or the projection electrode 8, was thus prevented from deforming greatly and the conductive layer 6 of the projection electrode 8 had no breaks.

Through curing of the joint material 25, which is formed of epoxy resin, the projection electrode 8 and the terminal electrode 22 are fixed and maintained in a mutually connected state. Accordingly, the semiconductor device 1 is implemented on the wiring substrate 20 while maintaining the reliability of connection between each projection electrode 8 of the semiconductor device 1 and the associated terminal electrode 22 of the wiring substrate 20.

The illustrated embodiment also has the following advantages.

(11) In the illustrated embodiment, the glass transition temperature of the resin forming each projection 5 is higher than the curing temperature of the joint material 25. In other words, the joint material 25 is formed of the epoxy resin the curing temperature of which is 250 degrees Celsius. The projection 5 is formed of the phenol resin the glass transition temperature of which is approximately 300 degrees Celsius.

Accordingly, the mounting temperature of the semiconductor device 1 can be set to 270 degrees Celsius, which is lower than the glass transition temperature (approximately 300 degrees Celsius) of the phenol resin, the material of the projections 5. In this manner, the semiconductor device 1 is implemented on the wiring substrate 20 while the elasticity coefficient of each projection 5 is maintained at a relatively high level. This prevents the projections 5 from deforming excessively in implementation of the semiconductor device 1, so that the conductive layer 6 formed in the projection electrode 8 has no breaks. The reliability of the connection between each projection electrode 8 of the semiconductor device 1 and the associated terminal electrode 22 of the wiring substrate 20 is thus improved.

(12) In the illustrated embodiment, each projection 5 is formed in the substantially semispherical shape. Thus, in heating and pressing of the semiconductor device 1, pressure focally acts on a portion of the projection 5 in the vicinity of the apex of the projection 5. That is, even if the resin forming each projection 5 as a whole exhibits a relatively high elasticity coefficient, load caused by mounting of the semiconductor device 1 focally acts on the portion of the projection 5 in the vicinity of the apex. This restricts deformation of the projection 5 only to the resin corresponding to the portion in the vicinity of the apex of the projection 5. Thus, the contact area between the projection electrode 8 and the terminal electrode 22 is increased. As a result, the reliability of the connection between each projection electrode 8 of the semiconductor device 1 and the associated terminal electrode 22 of the wiring substrate 20 is further reliably improved.

(13) In the illustrated embodiment, the phenol resin is employed as the material of each projection 5. The glass transition temperature of the phenol resin is approximately 300 degrees Celsius. The joint material 25 is formed of the epoxy resin the curing temperature of which is approximately 270 degrees Celsius. Thus, at the curing temperature of the epoxy resin, the phenol resin forming the projection 5 maintains a relatively high coefficient of elasticity. Each projection 5 is thus prevented from deforming excessively when the semiconductor device 1 is implemented on the wiring substrate 20. This prevents the conductive layer 6 of each projection electrode 8 from having a break. Accordingly, the reliability of the connection between each projection electrode 8 of the semiconductor device 1 and the associated terminal electrode 22 of the wiring substrate 20 is increased.

(14) In the illustrated embodiment, the joint material 25 is a nonconductive paste (NCP) formed of the epoxy resin. That is, the joint material 25 does not contain conductive particles. Accordingly, using the inexpensive nonconductive joint material 25, the semiconductor device 1 is reliably implemented on the wiring substrate 20. Each projection electrode 8 of the semiconductor device 1 is thus electrically connected to the associated terminal electrode 22 of the wiring substrate 20 with improved reliability, while maintaining productivity.

The illustrated embodiment may be modified as follows.

In FIGS. 5 to 7 of the illustrated embodiment, the projection 5 is formed of the phenol resin the glass transition temperature of which is 300 degrees Celsius. However, the projection 5 may be formed of a different resin other than the phenol resin, as long as the glass transition temperature of the material is not less than 270 degrees Celsius. Also in this case, the joint material 25 may be formed of material the curing temperature of which is not less than 250 degrees Celsius, thus improving productivity. This improves the reliability of the connection between each projection electrode 8 of the semiconductor device 1 and the associated terminal electrode 22 of the wiring substrate 20 while maintaining the productivity.

In FIGS. 5 to 7 of the illustrated embodiment, each projection 5 is formed of the phenol resin. However, the projection 5 may be formed of, for example, polyimide resin that has a relatively high glass transition temperature. In this case, in implementation of the semiconductor device 1, the resin forming the projection 5 maintains a relatively high coefficient of elasticity. This prevents the projection 5 from deforming excessively, and the conductive layer 6 has no breaks. The reliability of the connection between each projection electrode 8 of the semiconductor device 1 and the associated terminal electrode 22 of the wiring substrate 20 is thus raised.

In the illustrated embodiment, each opening 9a of the mask 9 has the circular shape corresponding to the shape of the substantially semispherical projection 5 as viewed from above. However, the shape of the opening 9a may be a different shape other than the circular shape, for example, a rectangular shape. In this case, through exposure to the ultraviolet rays 10, the projecting body 5b is shaped in a parallelepiped shape. The projecting body 5b is then allowed to melt so that surface tension is generated. This also forms the projection 5 having the semicircular cross-sectional shape.

In the illustrated embodiment, through radiation of the ultraviolet rays 10 onto the mask 9, the portions of the resin layer 5a exposed through the openings 9a are subjected to ultraviolet cross-linking. The projecting bodies 5b are thus provided. However, instead of this, electron beams may be radiated onto the mask 9. The portions of the resin layer 5a exposed through the openings 9a are thus subjected to electron beam cross-linking for shaping the projecting bodies 5b.

In the illustrated embodiment, each of the substantially semispherical projections 5 is formed by melting the corresponding projecting body 5b through exposure to the infrared rays 11. However, instead of this, each projecting body 5b may be heated by radiation heat that is caused by different means such as laser beams. Particularly, since the laser beams can perform focal heating, the projecting bodies 5b are easily heated and molten. This further improves the productivity of the semiconductor device 1.

In the illustrated embodiment, each projection 5 is formed in correspondence with the associated electrode 3 arranged on the semiconductor substrate 2. However, as shown in FIGS. 8A and 8B, a single projection 5 may be provided for the multiple electrodes 3. The conductive layers 6 are formed on an upper surface of the projection 5 in correspondence with the electrodes 3. Each of the electrodes 3 is electrically connected to the corresponding conductive layer 6. This shortens the time for manufacturing the semiconductor device 1, or improves the productivity, compared to the structure in which the multiple projections 5 are formed in correspondence with the electrodes 3. Further, the reliability of the connection between each projection electrode 8 of the semiconductor device 1 and the associated terminal electrode 22 of the wiring substrate 20 is improved.

Although the protection film 4 of the illustrated embodiment is formed of silicon oxide, the protection film 4 may be formed of silicon nitride or polyimide resin.

Although the thickness of the protection film 4 is not restricted to a certain level in the illustrated embodiment, the dimension may be set to, for example, approximately one micrometer.

In the illustrated embodiment, each of the conductive layers 6 is formed in the rectangular shape through patterning. However, each conductive layer 6 may be formed in a different shape other than the rectangular shape, such as a square shape, through patterning.

Although each conductive layer 6 of the illustrated embodiment is formed of gold, the conductive layer 6 may be formed of different metal such as copper, nickel, titanium, and aluminum.

Therefore, the present examples and embodiments are to be considered as illustrative and not restrictive and the invention is not to be limited to the details given herein, but may be modified within the scope and equivalence of the appended claims.

The invention claimed is:

1. A method for manufacturing a semiconductor device, comprising:

forming an electrode on a substrate;

providing an insulating protection film that covers the electrode and the substrate while a part of the electrode is exposed;

providing a resin layer that covers an entirety of the protection film and the exposed part of the electrode, the resin layer is formed of photosensitive resin;

positioning a mask on the resin layer;

radiating rays onto the mask so that a columnar projecting body having a flat upper end is obtained from the resin layer, and another part of the resin layer is removed;

heating the columnar projecting body with radiation heat so that the columnar projection body is melted and a semicircular projection having a semicircular cross-sectional shape is formed;

providing a conductive material layer that covers the exposed part of the electrode and the semicircular projection; and providing a conductive layer by patterning the conductive material layer, the conductive layer is electrically connected to the exposed part of the electrode, the conductive layer being extended to an upper surface of the semicircular projection.

2. The method according to claim 1, wherein the electrode is one of a plurality of adjacently arranged electrodes, wherein the semicircular projection is formed in a manner straddling the electrodes, wherein the conductive layer is one of a plurality of conductive layers formed on the upper surface of the semicircular projection in correspondence with the electrodes, and wherein each of the conductive layers is electrically connected to the corresponding one of the electrodes.

* * * * *